United States Patent
Wang et al.

(10) Patent No.: US 11,532,716 B2
(45) Date of Patent: Dec. 20, 2022

(54) NON-VOLATILE MEMORY DEVICE AND METHOD FOR FABRICATING THE SAME

(71) Applicant: United Microelectronics Corp., Hsinchu (TW)

(72) Inventors: Chia-Wen Wang, Tainan (TW); Chien-Hung Chen, Hsinchu (TW); Chia-Hui Huang, Tainan (TW); Jen Yang Hsueh, Tainan (TW); Ling Hsiu Chou, Tainan (TW); Chih-Yang Hsu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 233 days.

(21) Appl. No.: 16/793,930

(22) Filed: Feb. 18, 2020

(65) Prior Publication Data
US 2021/0217866 A1    Jul. 15, 2021

(30) Foreign Application Priority Data
Jan. 9, 2020    (CN) .......................... 202010022120.7

(51) Int. Cl.
| | |
|---|---|
| *H01L 29/423* | (2006.01) |
| *H01L 27/11521* | (2017.01) |
| *H01L 29/51* | (2006.01) |
| *H01L 29/788* | (2006.01) |
| *H01L 21/762* | (2006.01) |
| *H01L 21/28* | (2006.01) |
| *H01L 29/66* | (2006.01) |
| *G11C 16/16* | (2006.01) |
| *G11C 16/14* | (2006.01) |

(52) U.S. Cl.
CPC ........ *H01L 29/42328* (2013.01); *G11C 16/14* (2013.01); *G11C 16/16* (2013.01); *H01L 21/76224* (2013.01); *H01L 27/11521* (2013.01); *H01L 29/40114* (2019.08); *H01L 29/513* (2013.01); *H01L 29/518* (2013.01); *H01L 29/66825* (2013.01); *H01L 29/7881* (2013.01)

(58) Field of Classification Search
CPC ......... H01L 29/66833; H01L 29/66825; H01L 29/788–7889; G11C 16/16; G11C 16/14
See application file for complete search history.

(56) References Cited

U.S. PATENT DOCUMENTS

| | | | |
|---|---|---|---|
| 9,269,766 B2 | 2/2016 | Wu et al. | |
| 2005/0045940 A1* | 3/2005 | Chen | ...................... H01L 27/115 257/315 |
| 2008/0283899 A1 | 11/2008 | Hendriks et al. | |
| 2010/0133602 A1* | 6/2010 | Do | ..................... H01L 27/11521 257/E21.409 |
| 2016/0307755 A1* | 10/2016 | Kim | .................... H01L 21/0338 |

* cited by examiner

*Primary Examiner* — Grant S Withers
(74) *Attorney, Agent, or Firm* — J.C. Patents (57) ABSTRACT

A non-volatile memory device includes a substrate. A plurality of shallow trench isolation (STI) lines are disposed on the substrate and extend along a first direction. A memory gate structure is disposed on the substrate between adjacent two of the plurality of STI lines. A trench line is disposed in the substrate and extends along a second direction intersecting the first direction, wherein the trench line also crosses top portions of the plurality of STI lines. A conductive line is disposed in the trench line and used as a selection line to be coupled to the memory gate structure.

20 Claims, 9 Drawing Sheets

NON-VOLATILE MEMORY DEVICE AND METHOD FOR FABRICATING THE SAME

CROSS-REFERENCE TO RELATED APPLICATION

This application claims the priority benefit of Chinese patent application serial no. 202010022120.7, filed on Jan. 9, 2020. The entirety of the above-mentioned patent application is hereby incorporated by reference herein and made a part of this specification.

BACKGROUND OF THE INVENTION

1. Field of the Invention

The invention relates to a semiconductor fabrication technology, and more particularly, to a non-volatile memory device and a method for fabricating the same.

2. Description of Related Art

A non-volatile memory device is a very common memory device that may be configured to store data. However, in response to a requirement for maintaining a small volume but a large storage capacity, structural design of the non-volatile memory device is still being developed.

For a structure of the non-volatile memory device, such as a flash memory, one design thereof includes an erasing gate (EG) line and a selection line (SL), wherein the erasing gate is shared by two memory cells. For general design, a shallow trench isolation (STI) structure corresponding to two adjacent control gate (CG) lines is cut off, and the erasing gate line is between the cut shallow trench isolation structures.

When the control gate lines are subsequently formed, if a sidewall of the shallow trench isolation structure is covered due to an alignment shift, an etching process that defines the control gate line may remain on the sidewall of the shallow trench isolation structure. A conductive substance remaining on the sidewall by the control gate line may cause improper bridging between floating gates due to a residual on the sidewall between adjacent memory cells in a direction of the control gate line, thereby causing product defects.

How to design the structure of the non-volatile memory device to at least reduce the improper bridging of the floating gate needs to be taken into account for product development.

SUMMARY OF THE INVENTION

The invention proposes a non-volatile memory device and a method for fabricating the same. A selection line is formed, so that a residue on a sidewall of a floating gate may be effectively removed, and the possibility of improper bridging may be reduced.

In an embodiment, the invention provides a non-volatile memory device. The non-volatile memory device includes a substrate. A plurality of shallow trench isolation (STI) lines are disposed on the substrate and extend along a first direction. A memory gate structure is disposed on the substrate between adjacent two of the plurality of STI lines. A trench line is disposed in the substrate and extends along a second direction intersecting the first direction, wherein the trench line also crosses top portions of the plurality of STI lines. A conductive line is disposed in the substrate and used as a selection line to be coupled to the memory gate structure.

In an embodiment, for the non-volatile memory device, the plurality of STI lines are higher than a surface of the substrate, and the memory gate structure includes a gate insulation layer on the substrate. A floating gate layer is disposed on the gate insulation layer and between the adjacent two of the plurality of STI lines. A dielectric layer is disposed on the floating gate layer. A control gate line is disposed on the floating gate layer and extends along the second direction. A cap layer is disposed on the control gate line. A first insulation layer is disposed at least on sidewalls of the floating gate layer, the control gate line, and the cap layer.

In an embodiment, for the non-volatile memory device, the dielectric layer includes an oxide/nitride/oxide (ONO) structure.

In an embodiment, for the non-volatile memory device, the control gate line crosses the plurality of STI lines to be connected to a plurality of memory cells.

In an embodiment, the non-volatile memory device further includes a second insulation layer disposed on the substrate and covering the conductive line. An erasing gate line is disposed on the conductive line and abuts against the memory gate structure.

In an embodiment, for the non-volatile memory device, the erasing gate line extends along the second direction and is between adjacent two of the memory gate structures.

In an embodiment, for the non-volatile memory device, a portion of the floating gate layer extends outward from the control gate line and is between the control gate line and the conductive line.

In an embodiment, for the non-volatile memory device, the erasing gate line includes a lower portion adjacent to the sidewalls of the control gate line and the cap layer.

In an embodiment, for the non-volatile memory device, the conductive line includes doped polysilicon, tungsten, copper, or metal.

In an embodiment, the non-volatile memory device further includes a word line crossing the plurality of STI lines, extending along the second direction, and being on one side of the memory gate structure opposite to the conductive line.

In an embodiment, the invention also provides a method for fabricating a non-volatile memory device, the method including: providing a substrate; forming a plurality of shallow trench isolation (STI) lines on the substrate, the STI lines extending along a first direction; forming a memory gate structure on the substrate between adjacent two of the plurality of STI lines; forming a trench line in the substrate, the trench line extending along a second direction intersecting the first direction and also crossing top portions of the plurality of STI lines; and forming a conductive line in the substrate, the conductive line being used as a selection line to be coupled to the memory gate structure.

In an embodiment, for the method for fabricating the non-volatile memory device, the plurality of STI lines are higher than a surface of the substrate, and the formed memory gate structure includes a gate insulation layer on the substrate. A floating gate layer is disposed on the gate insulation layer and between the adjacent two of the plurality of STI lines. A dielectric layer is disposed on the floating gate layer. A control gate line is disposed on the floating gate layer and extends along the second direction. A cap layer is disposed on the control gate line. A first insulation layer is disposed at least on sidewalls of the floating gate layer, the control gate line, and the cap layer.

In an embodiment, for the method for fabricating the non-volatile memory device, the dielectric layer includes an oxide/nitride/oxide (ONO) structure.

In an embodiment, for the method for fabricating the non-volatile memory device, the formed control gate line crosses the plurality of STI lines to be connected to a plurality of memory cells corresponding to each of floating gate layers.

In an embodiment, the method for fabricating the non-volatile memory device further includes: forming a second insulation layer on the substrate, the second insulation layer covering the conductive line; and forming an erasing gate line on the conductive line, the erasing gate line abutting against the memory gate structure.

In an embodiment, for the method for fabricating the non-volatile memory device, the formed erasing gate line extends along the second direction, and is between adjacent two of a plurality of memory gate structures distributed in the first direction.

In an embodiment, for the method for fabricating the non-volatile memory device, a portion of the formed floating gate layer extends outward from the control gate line and is between the control gate line and the conductive line.

In an embodiment, for the method for fabricating the non-volatile memory device, the erasing gate line includes a lower portion adjacent to the sidewalls of the control gate line and the cap layer.

In an embodiment, for the method for fabricating the non-volatile memory device, the conductive line includes doped polysilicon, tungsten, copper, or metal.

In an embodiment, the method for fabricating the non-volatile memory device further includes: forming a word line crossing the plurality of STI lines, extending along the second direction, and being on one side of the memory gate structure opposite to the conductive line.

BRIEF DESCRIPTION OF THE DRAWINGS

The accompanying drawings are included to provide a further understanding of the invention, and are incorporated in and constitute a part of this specification. The accompanying drawings illustrate embodiments of the invention and, together with the description, serve to explain the principles of the invention.

DESCRIPTION OF THE EMBODIMENTS

The invention relates to a structure of a non-volatile memory device and a method for fabricating the same. In the structure of the non-volatile memory device, due to changes in a method for fabricating a selection line and the formed structure, a phenomenon of improper bridging may be effectively reduced at least between adjacent memory cells distributed along a control gate line.

Some embodiments are used as examples to describe the invention, but the invention is not limited to the embodiments. In addition, the described embodiments allow for possible combinations.

Figure 1:
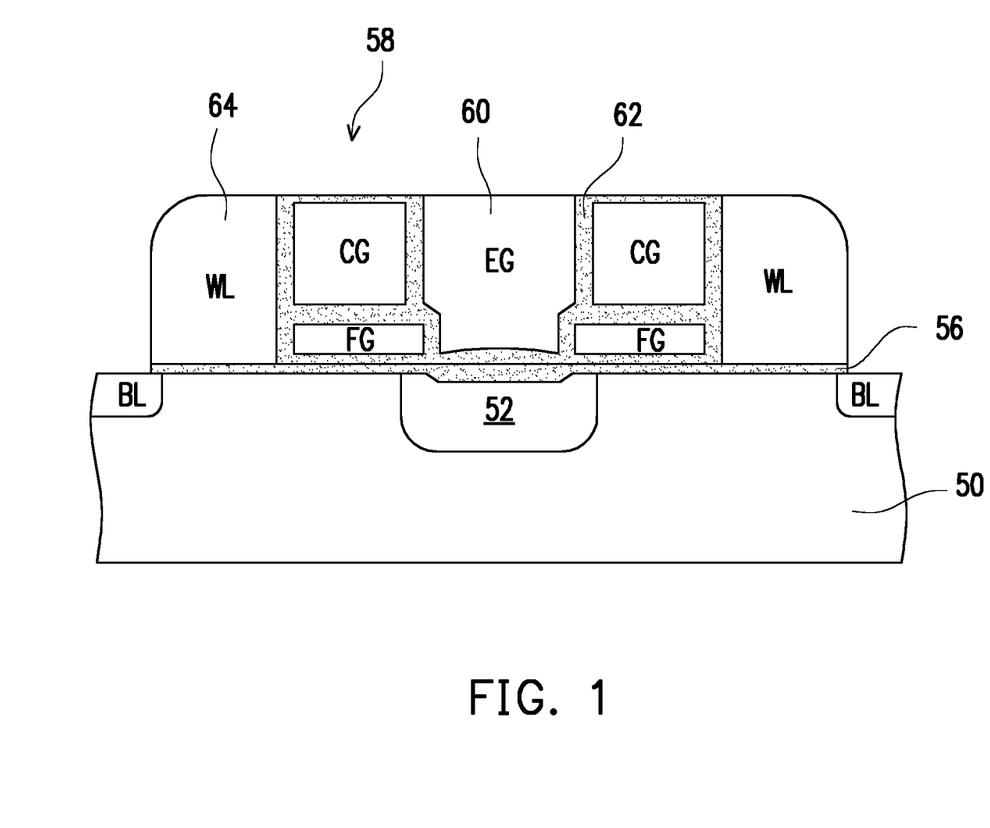
FIG. 1 is a schematic diagram of a cross-sectional structure of a non-volatile memory device according to an embodiment of the invention.

FIG. 1 is a schematic diagram of a cross-sectional structure of a non-volatile memory device according to an embodiment of the invention. Referring to FIG. 1, FIG. 1 shows a cross-sectional structure of a non-volatile memory device according to the invention. Generally, the non-volatile memory device is formed on a substrate 50 and includes a memory gate structure 58, an erasing gate line 60, and a word line 64. The memory gate structure 58 includes a floating gate FG and a control gate CG. The erasing gate line 60 is also denoted by EG. The word line 64 is also denoted by WL. There is an insulating layer 62 made of a dielectric material between sidewalls of the memory gate structure 58, the erasing gate line 60, and the word line 64 for proper isolation. The memory gate structure 58, the erasing gate line 60, and the word line 64 also have the insulating layer 56 made of a dielectric material and isolated from the substrate 50. There are various doped regions in the substrate 50, including bit lines BL and selection lines 52. Some of the bit lines BL corresponding to the memory gate structure 58 also serve as a drain region, that is, the bit lines BL are connected to the drain region. Some of the selection lines 52 corresponding to the memory gate structure 58 also serve as a source region, that is, the selection lines 52 are connected to the source region. The selection lines 52 are generally below the erasing gate line 60 and is isolated by an insulating layer 56.

The structure of the non-volatile memory device according to FIG. 1 of the invention is further looked into in order to propose a mechanism for improving the non-volatile memory device.

Figure 2:
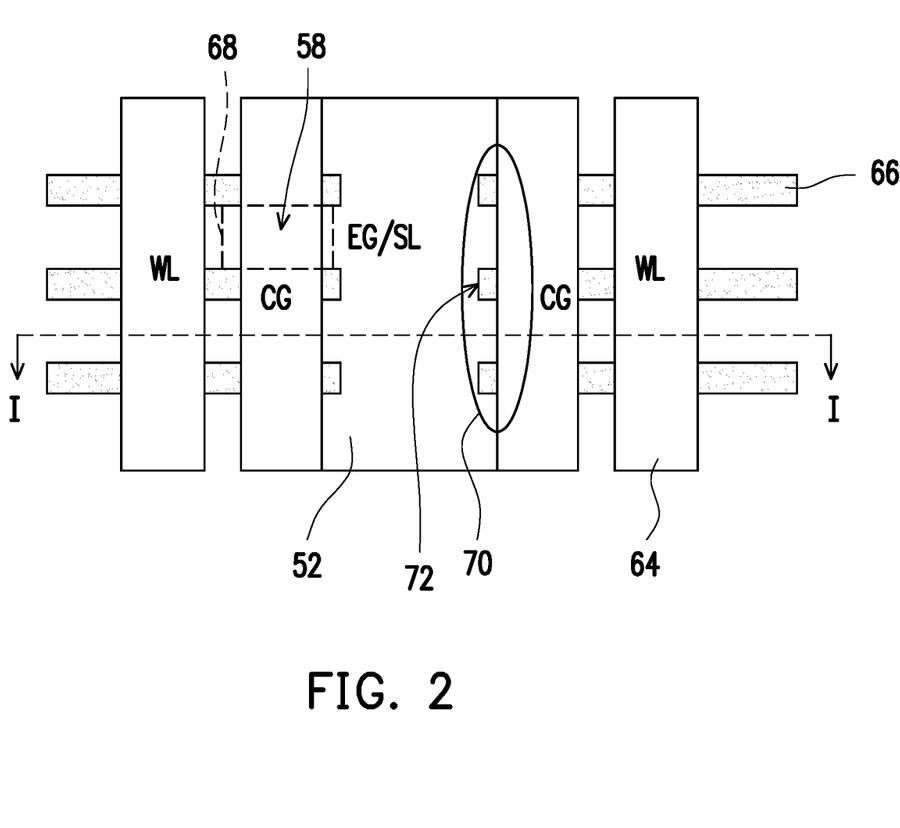
FIG. 2 is a schematic diagram of configuration in a top view of a partial structure of the non-volatile memory device corresponding to FIG. 1.

FIG. 2 is a schematic diagram of configuration in a top view of a partial structure of the non-volatile memory device corresponding to FIG. 1. Referring to FIG. 1 and FIG. 2, the structure of the non-volatile memory device of FIG. 1 is a cross-sectional structure taken along a cutting line I-I of FIG. 2. From the configuration in the top view, a memory gate structure 58 of a memory cell 68 is formed between two adjacent shallow trench isolation (STI) structures 66 and is located below a control gate line CG. The STI structure 66 is a linear structure and is formed in a substrate 50. Selection lines (SL) 52 are shared by two memory cells on the left and right and are between two control gate lines CG. As shown in FIG. 1, an erasing gate line (EG) 60 is above the selection lines (SL) 52.

For the structure of the non-volatile memory device, the STI structure 66 is disconnected, and in accordance with the fabricating process, the control gate line CG is completed at a later stage. After the investigation of the invention, in the process of defining the control gate line CG, an initial material of the control gate line CG may cover a region 70 in the middle of the STI structure 66 due to an alignment shift, and then the STI structure 66 may have residues similar to a gap wall on a sidewall 72 of the region 70, which may cause bridging between adjacent memory cells. The residues of the gap wall may be connected to a floating gate layer FG of the memory cell, which may cause bridging between adjacent memory cells.

The invention proposes the structure of the non-volatile memory device and the method for fabricating the same after exploring possible defects, which may reduce at least the phenomenon of bridging between adjacent memory cells.

Figure 3:
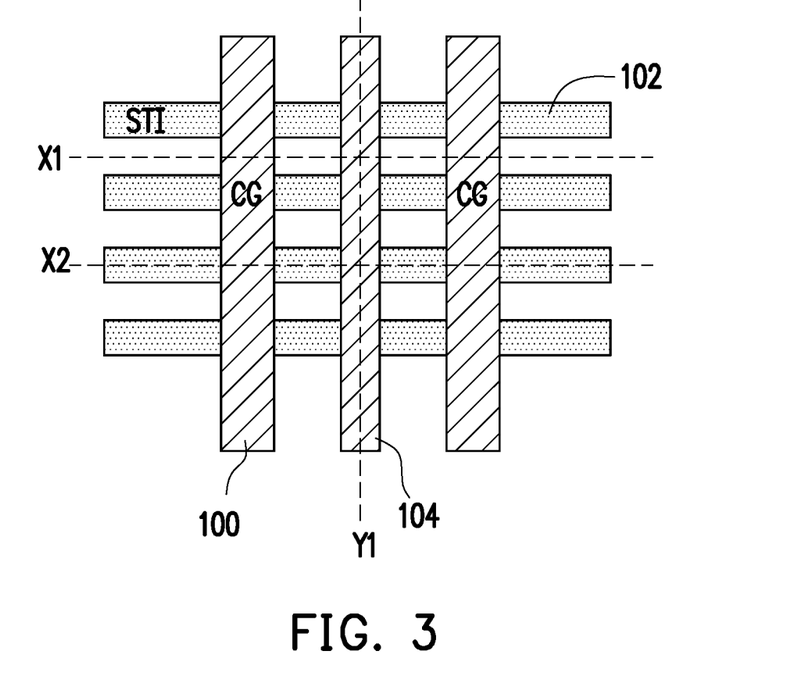
FIG. 3 is a schematic diagram of configuration in a top view of a partial structure of a non-volatile memory device according to an embodiment.
Figure 4:
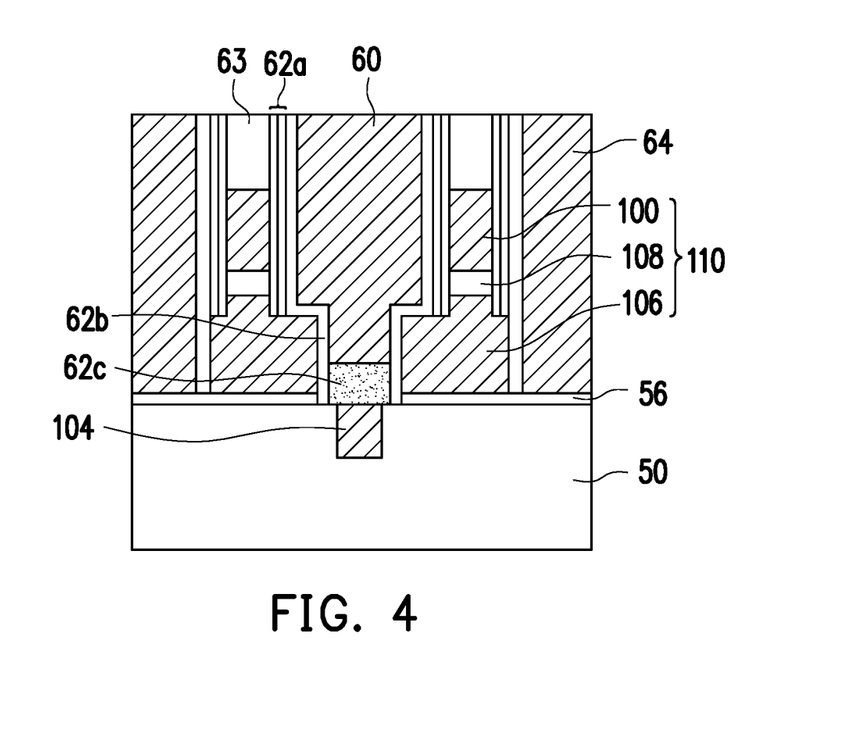
FIG. 4 is a schematic diagram of a cross-sectional structure taken along a cutting line X1 of FIG. 3 according to an embodiment.
Figure 5:
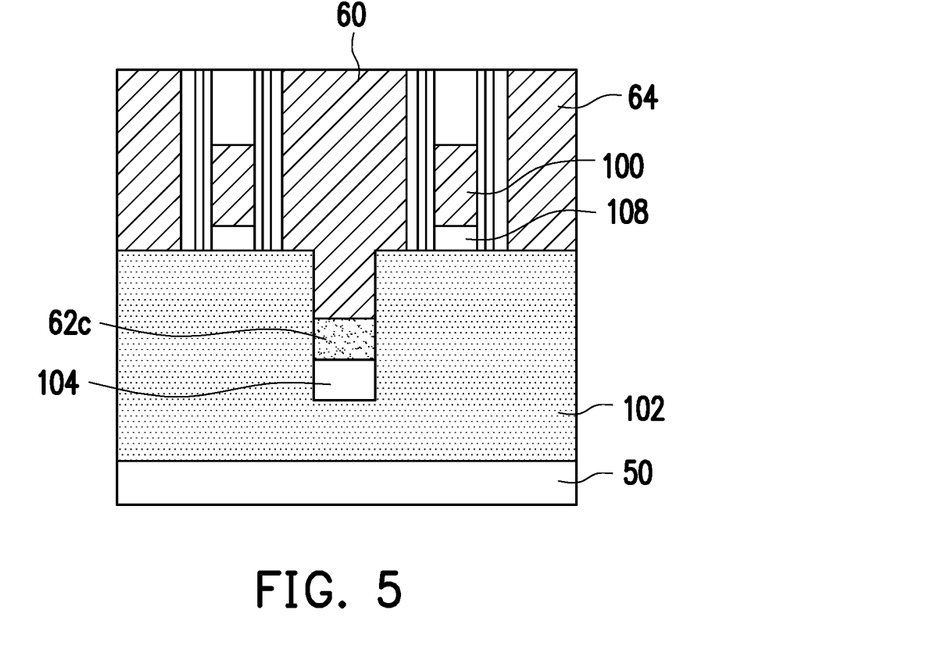
FIG. 5 is a schematic diagram of a cross-sectional structure taken along a cutting line X2 of FIG. 3 according to an embodiment.

FIG. 3 is a schematic diagram of configuration in a top view of a partial structure of a non-volatile memory device according to an embodiment. FIG. 4 is a schematic diagram of a cross-sectional structure taken along a cutting line X1 of FIG. 3 according to an embodiment. FIG. 5 is a schematic diagram of a cross-sectional structure taken along a cutting line X2 of FIG. 3 according to an embodiment. Referring to FIG. 3, FIG. 4, and FIG. 5, the invention changes methods for configuring a shallow trench isolation (STI) line 102 and a selection line 104 of a non-volatile memory device. The STI line 102 is maintained to extend along a direction of a cutting line X1. It may be clearly seen in FIG. 5, the STI line 102 is not disconnected between two control gate lines (CG) 100. The selection line 104 is first formed into a trench line formed in the substrate 50, and a conductive material of the selection line 104 is filled in the trench line, for example, doped polysilicon, tungsten, copper, or metal, which is not limited thereto. An erasing gate line 60 is above the selection line 104. The erasing gate line 60 is isolated from the selection line 104 by an insulation layer 62c such as an oxide. Positions of memory cells are on the left and right sides of the erasing gate line 60, including a memory gate structure 110. The memory gate structure 110 includes a floating gate layer 106 and a portion of the control gate lines 100 above the floating gate layer 106 as a control gate layer. The insulation layer 108 isolates the floating gate layer 106 and the control gate line 100. A cap layer 63 is also disposed on a top of the memory gate structure 110. The memory gate structure 110 and the substrate 50 are separated by an insulation layer 56.

A word line 64 is disposed on an outer side of the memory gate structure 110. In addition, a plurality of insulation layers 62a and 62b on sidewalls at different positions are configured to achieve isolation between the memory gate structure 110 and the word line 64. A corresponding source region and drain region in the substrate 50 may be disposed in a general mode, and the descriptions thereof are omitted herein. The insulation layer is also designed according to actual needs, for example, may include an insulation layer 62a of a laminated structure or an insulation layer 62b of a single-layer structure. The invention is not limited to a particular manner in which the insulation layer is configured.

As described above, the selection line 104 is formed into a trench line on the substrate 50 after the control gate line 100 is formed first, and then a conductive line is filled as the selection line 104. The selection line 104 also does not need to cut the STI line 102. In the process of forming the selection line 104, the material of the control gate line 100 does not remain on the sidewall of the STI line 102, so that a phenomenon of bridging of memory cells may be reduced.

Figure 6:
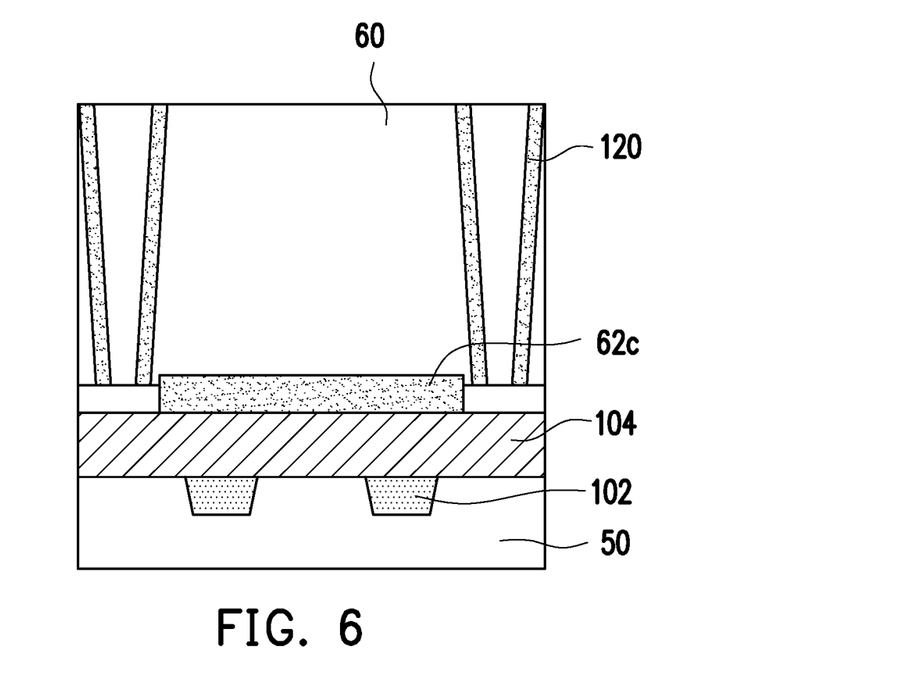
FIG. 6 is a schematic diagram of a cross-sectional structure taken along a cutting line Y1 of FIG. 3 according to an embodiment.

FIG. 6 is a schematic diagram of a cross-sectional structure taken along a cutting line Y1 of FIG. 3 according to an embodiment. Referring to FIG. 6, a direction of the cutting line Y1 is a direction intersecting the cutting line X1. A selection line 104 extends along a direction of the cutting line Y1 between control gate lines 100, which may cross a shallow trench isolation (STI) line 102. In another embodiment, a contact plug 120, for example, passes through an erasing gate line 60, is connected to a selection line 104 below the erasing gate line, and is used as a portion of connection members for external connection, but the invention is not limited to the present embodiment. The external connection of the erasing gate line 60 may be designed according to actual needs.

A method for fabricating a non-volatile memory device is described below. FIG. 7A to FIG. 7H are each a schematic flowchart of a method for fabricating a non-volatile memory device in a cross-sectional structure according to an embodiment.

Figure 7A:
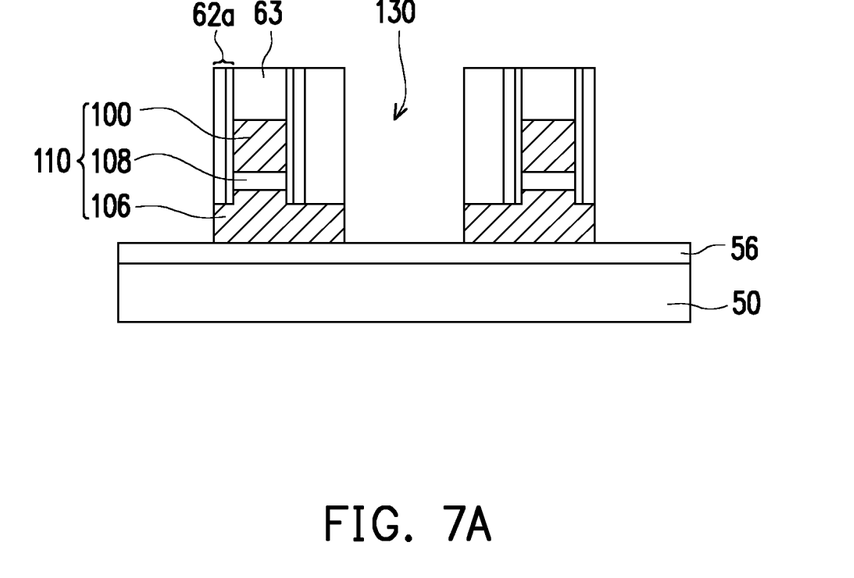
FIG. 7A to FIG. 7H are each a schematic flowchart of a method for fabricating a non-volatile memory device in a cross-sectional structure according to an embodiment.

Referring to FIG. 7A, the cross-sectional structure taken along the cutting line X1 in FIG. 3 is described. An insulation layer 56 and a memory gate structure 110 on the insulation layer 56 have been formed on a substrate 50. The memory gate structure 110 is between shallow trench isolation (STI) lines 102 as shown in FIG. 3, but there is no STI line 102 on the cutting line X1. A floating gate layer 106 is a block layer configured to store data via a mechanism for storing charges. Structures such as a control gate line 100 and a cap layer 63 have been formed on the floating gate layer 106. There is also an insulation layer 62a on a sidewall of the memory gate structure 110. Through the definition process of the floating gate layer 106, the floating gate layer 106 is formed on the insulation layer 56, of which a sidewall is exposed by an opening 130.

Figure 7B:
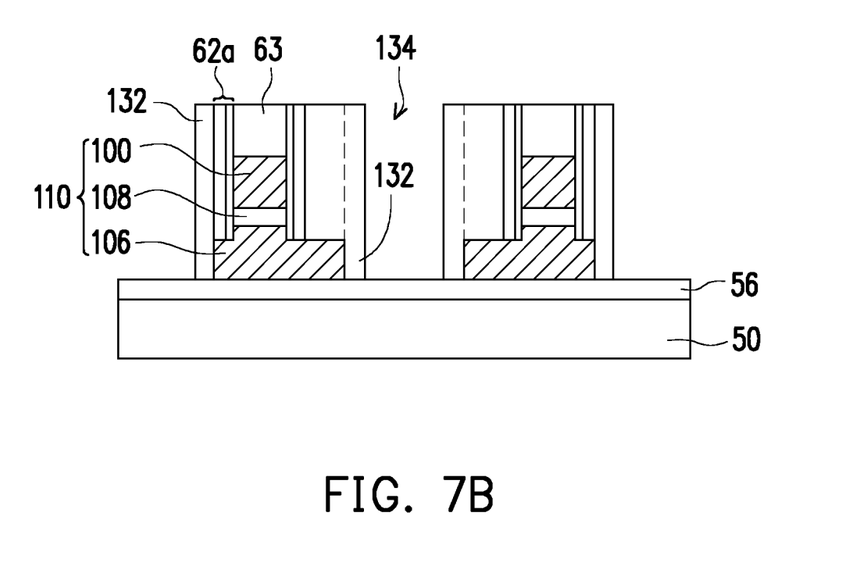

Referring to FIG. 7B, for example, a gap wall 132 of an oxide is formed on at least a sidewall of the floating gate layer 106. The opening 130 between the previous memory gate structures 110 is changed into an opening 134.

Figure 7C:
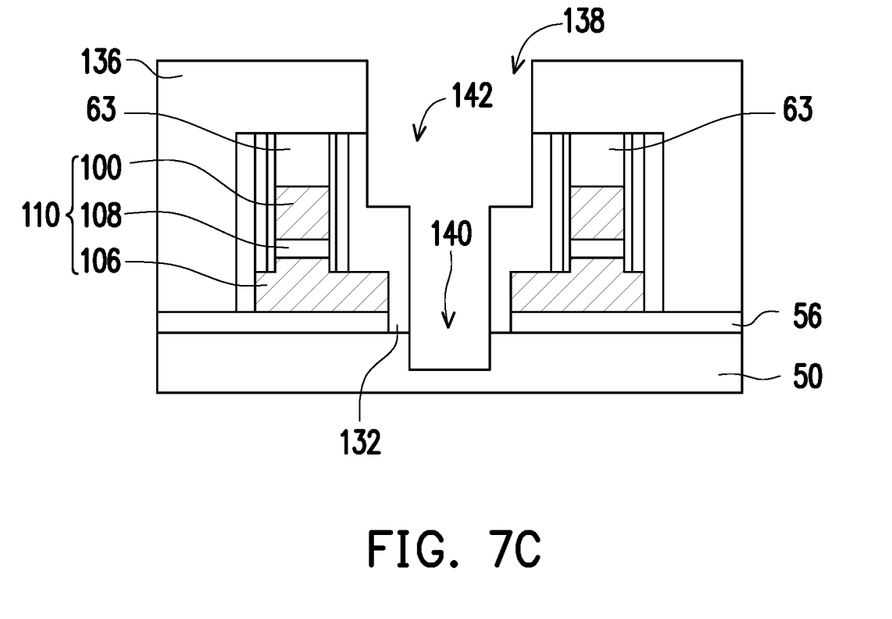

Referring to FIG. 7C, a patterned photoresist layer 136 covers the substrate 50. An opening 138 of the photoresist layer 136 is larger than the previous opening 134. The photoresist layer 136 is used as an etching mask to etch a trench line 142 having a certain depth for the gap wall 132, the insulation layer 56, and the substrate 50, and a trench line 140 may be formed in an exposed region of the substrate 50. A sidewall of the floating gate layer 106 remains to be covered by the gap wall 132.

Figure 7D:
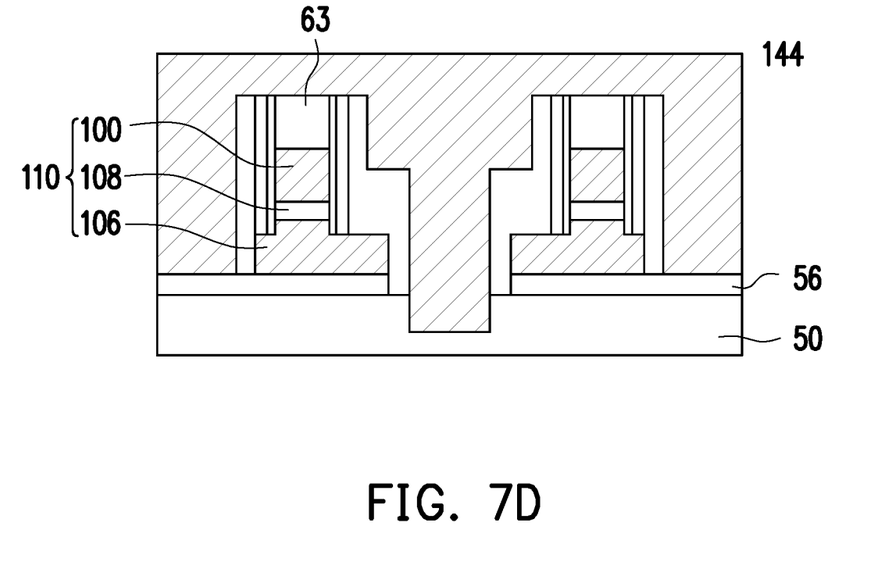

Referring to FIG. 7D, a conductive layer 144 covers the substrate 50 and fills the trench line 142 and the trench line 140.

Figure 7E:
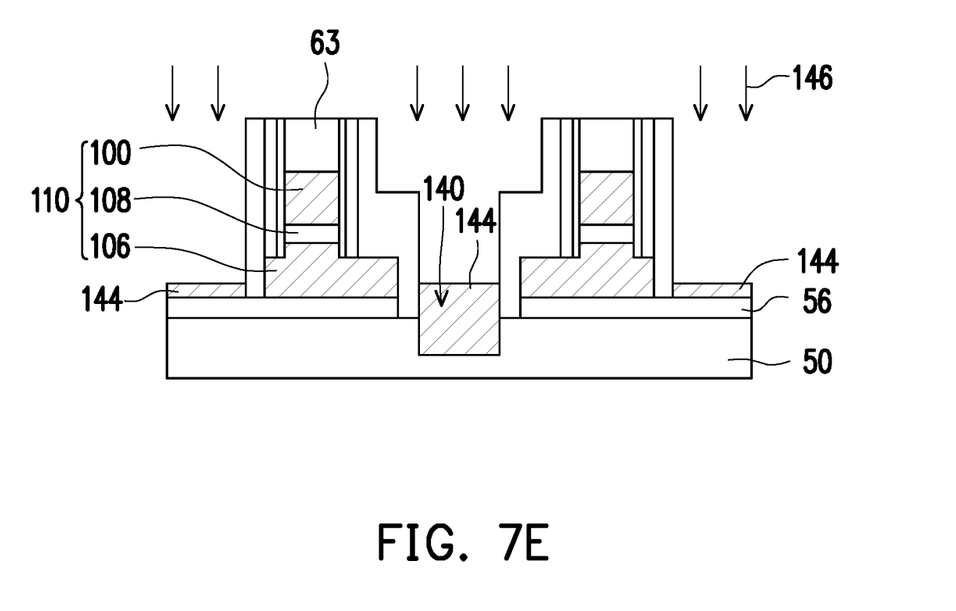

Referring to FIG. 7E, an etching back process 146 is performed to remove an upper portion of the conductive layer 144, and the remaining portion of the conductive layer remains to be filled in the trench line 140 to become the conductive layer 144 and then be used as a selection line SL. A material of the conductive layer 144 includes, for example, doped polysilicon, tungsten, copper, or metal, but is not limited thereto. In addition, some conductive layers 144 may also remain on an outer side of the memory gate structure 110.

Figure 7F:
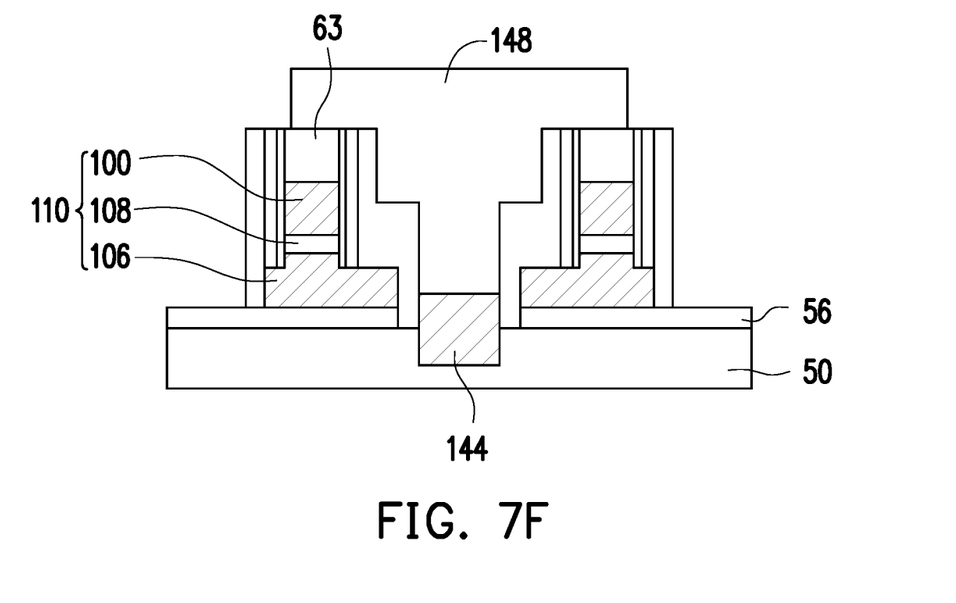

Referring to FIG. 7F, a photoresist layer 148 covers the memory gate structure 110 and the conductive layer 144, and the conductive layer 144 remaining on the outer side of the memory gate structure 110 is exposed. The photoresist layer 148 is used as an etching mask to remove the conductive layer 144 remaining on the outer side of the memory gate structure 110 through an etching process.

Figure 7G:
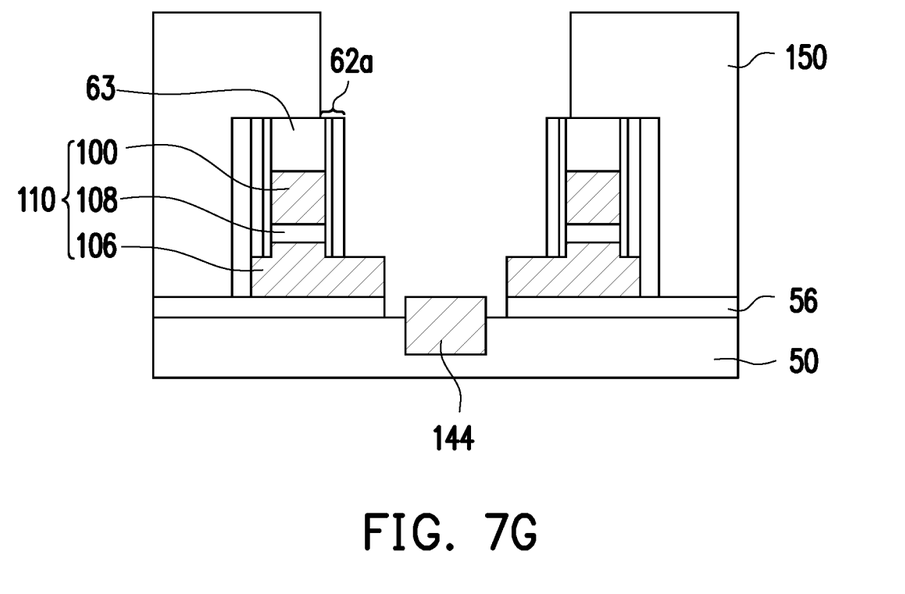

Referring to FIG. 7G, after the photoresist layer 148 is removed, a photoresist layer 150 is formed to cover the outer side of the memory gate structure 110. The photoresist layer 150 is used as an etching mask to remove the gap wall 132 remaining on an inner side of the memory gate structure 110 through an etching process, to expose the conductive layer 144. The etching process is removing an oxide. Accordingly, the insulation layer 62a on the sidewall of the memory gate structure 110 still covers the sidewall, and an outer layer of the insulation layer is a nitride and may be retained. In addition, if the material of the conductive layer 144 is polysilicon, the conductive layer 144 may be additionally doped to increase conductivity. Since the gap wall 132 previously on the sidewall of the floating gate layer 106 is removed, the conductive layer 144 and the sidewall of the floating gate layer 106 are exposed.

Figure 7H:
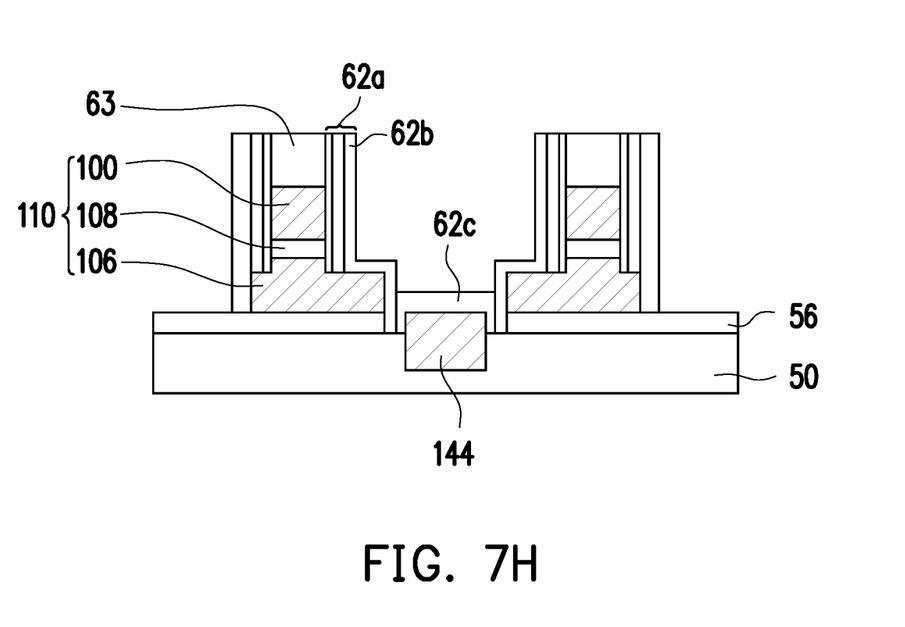

Referring to FIG. 7H, an insulation layer 62c may be formed on an exposed surface region of the conductive layer 144. In addition, another insulation layer 62b is further formed on the insulation layer 62a. As described above, the method for forming the insulation layer is not limited to the method described. The insulation layer is configured to isolate functions of some conductive members or in other ways.

After the conductive layer 144 is completed, the conductive layer is subsequently used as a selection line. Therefore, members such as the erasing gate line may be continuously formed to complete the structure of the non-volatile memory device shown in FIG. 3 and FIG. 4. The descriptions thereof are omitted herein.

Figure 8:
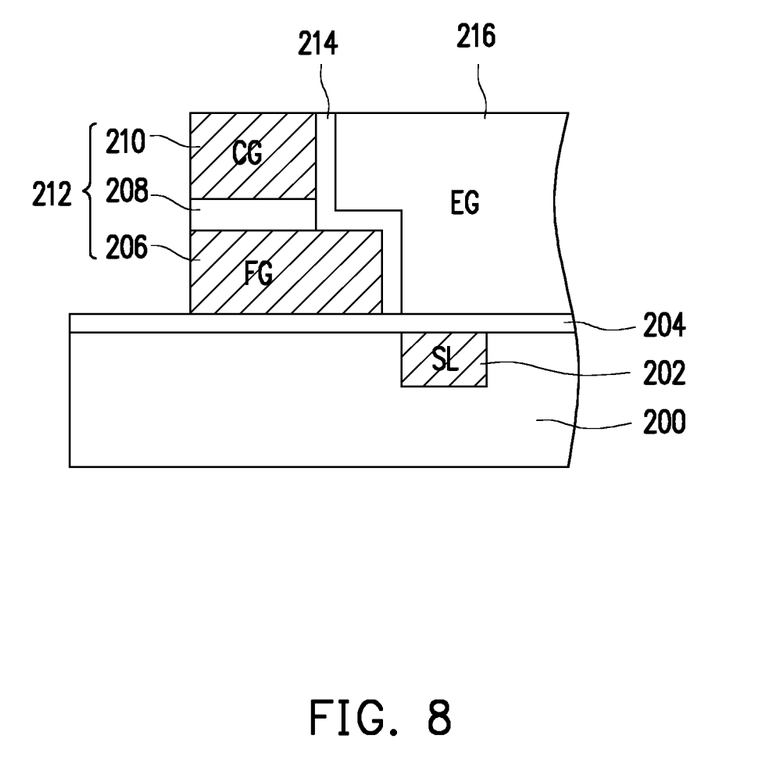
FIG. 8 is a schematic diagram of a cross-sectional structure of a non-volatile memory device according to an embodiment of the invention.

FIG. 8 is a schematic diagram of a cross-sectional structure of a non-volatile memory device according to an embodiment of the invention. Referring to FIG. 8, in an embodiment, in combination with the formation of a selection line SL and from a broader perspective, the structure of the non-volatile memory device forms a selection line (SL) 200 in a substrate 200. The substrate 200 is, for example, a silicon substrate. However, after the selection line (SL) 200 is formed into a trench line through etching, and then a conductive material is filled in the trench lines to form the selection line (SL) 200. In other words, the selection line (SL) 200 may not be formed by doping the substrate 200 in the previous stage of the fabrication process. The selection line (SL) 200 is, for example, completed after a memory gate structure 212 is formed. A shallow trench isolation (STI) line does not need to be cut off either. There is an insulation layer 204 on the substrate 200. The memory gate structure 212 is on the insulation layer 204, including a floating gate layers (FG) 206, a control gate layer (CG) 210, and an insulation layer 208 between the floating gate layer (FG) 206 and the control gate layer (CG) 210. An erasing gate line (EG) 216 on the insulation layer 204 is above the selection line (SL) 200 and abuts against the memory gate structure 212, and both are isolated by an insulation layer 214 therebetween.

The selection line (SL) 104 of the invention is formed into a trench line 140 through etching the substrate after the memory gate structure 110 is completed, and then a conductive line 144 is formed in the trench line 140 and used as the selection line 104. According to the method, the STI line 102 does not need to be cut off. Upon fabrication of the control gate line CG, the conductive line 144 is formed on the substrate 50 and the STI line 102 between two control gate lines. During formation of the conductive line 144, no residue is generated on the STI line 102. Under this architecture, there may be complete isolation between the floating gate layers FG of the memory cells, effectively alleviating the problem of bridging.

Finally, it should be noted that the foregoing embodiments are merely used for describing the technical solutions of the invention, but are not intended to limit the invention. Although the invention is described in detail with reference to the foregoing embodiments, a person of ordinary skill in the art should understand that, modifications may still be made to the technical solutions in the foregoing embodiments, or equivalent replacements may be made to some or all of the technical features; and such modifications or replacements will not cause the essence of corresponding technical solutions to depart from the scope of the technical solutions in the embodiments of the invention.

What is claimed is:

1. A non-volatile memory device, comprising:
   a substrate;
   a plurality of shallow trench isolation (STI) lines disposed on the substrate and extending along a first direction, wherein the plurality of STI lines are higher than a surface of the substrate;
   a memory gate structure disposed on the substrate between adjacent two of the plurality of STI lines;
   a trench line disposed in the substrate and extending along a second direction intersecting the first direction, wherein the trench line also crosses top portions of the plurality of STI lines;
   a conductive line disposed in the trench line and used as a selection line to be coupled to the memory gate structure; and
   an erasing gate line directly above the conductive line with respect to the substrate and abutting against the memory gate structure.

2. The non-volatile memory device according to claim 1, wherein the memory gate structure comprises:
   a gate insulation layer on the substrate;
   a floating gate layer disposed on the gate insulation layer and between the adjacent two of the plurality of STI lines;
   a dielectric layer disposed on the floating gate layer;
   a control gate line disposed on the floating gate layer and extending along the second direction;
   a cap layer disposed on the control gate line; and
   a first insulation layer disposed at least on sidewalls of the floating gate layer, the control gate line, and the cap layer.

3. The non-volatile memory device according to claim 2, wherein the dielectric layer comprises an oxide/nitride/oxide structure.

4. The non-volatile memory device according to claim 2, wherein the control gate line crosses the plurality of STI lines to be connected to a plurality of memory cells.

5. The non-volatile memory device according to claim 2, further comprising:
   a second insulation layer disposed on the substrate and covering the conductive line.

6. The non-volatile memory device according to claim 1, wherein the erasing gate line extends along the second direction and is between adjacent two of the memory gate structures.

7. The non-volatile memory device according to claim 2, wherein a portion of the floating gate layer extends outward from the control gate line and is between the control gate line and the conductive line.

8. The non-volatile memory device according to claim 7, wherein the erasing gate line comprises a lower portion adjacent to the sidewalls of the control gate line and the cap layer.

9. The non-volatile memory device according to claim 1, wherein the conductive line comprises doped polysilicon, tungsten, copper, or metal.

10. The non-volatile memory device according to claim 1, further comprising a word line crossing the plurality of STI lines, extending along the second direction, and being on one side of the memory gate structure opposite to the conductive line.

11. A method for fabricating a non-volatile memory device, comprising:
    providing a substrate;

forming a plurality of shallow trench isolation (STI) lines on the substrate, the STI lines extending along a first direction, wherein the plurality of STI lines are higher than a surface of the substrate;

forming a memory gate structure on the substrate between adjacent two of the plurality of STI lines;

forming a trench line in the substrate, the trench line extending along a second direction intersecting the first direction and also crossing top portions of the plurality of STI lines;

forming a conductive line in the trench line, the conductive line being used as a selection line to be coupled to the memory gate structure; and forming an erasing gate line directly above the conductive line with respect to the substrate, the erasing gate line abutting against the memory gate structure.

12. The method for fabricating the non-volatile memory device according to claim 11, wherein the formed memory gate structure comprises:

a gate insulation layer on the substrate;

a floating gate layer disposed on the gate insulation layer and between the adjacent two of the plurality of STI lines;

a dielectric layer disposed on the floating gate layer;

a control gate line disposed on the floating gate layer and extending along the second direction;

a cap layer disposed on the control gate line; and a first insulation layer disposed at least on sidewalls of the floating gate layer, the control gate line, and the cap layer.

13. The method for fabricating the non-volatile memory device according to claim 12, wherein the dielectric layer comprises an oxide/nitride/oxide structure.

14. The method for fabricating the non-volatile memory device according to claim 12, wherein the formed control gate line crosses the plurality of STI lines to be connected to a plurality of memory cells corresponding to each of the floating gate layers.

15. The method for fabricating the non-volatile memory device according to claim 12, further comprising:

forming a second insulation layer on the substrate, the second insulation layer covering the conductive line.

16. The method for fabricating the non-volatile memory device according to claim 11, wherein the formed erasing gate line extends along the second direction, and is between adjacent two of a plurality of memory gate structures distributed in the first direction.

17. The method for fabricating the non-volatile memory device according to claim 12, wherein a portion of the formed floating gate layer extends outward from the control gate line and is between the control gate line and the conductive line.

18. The method for fabricating the non-volatile memory device according to claim 17, wherein the erasing gate line comprises a lower portion adjacent to the sidewalls of the control gate line and the cap layer.

19. The method for fabricating the non-volatile memory device according to claim 11, wherein the conductive line comprises doped polysilicon, tungsten, copper, or metal.

20. The method for fabricating the non-volatile memory device according to claim 11, further comprising:

forming a word line crossing the plurality of STI lines, extending along the second direction, and being on one side of the memory gate structure opposite to the conductive line.

\* \* \* \* \*